(12) United States Patent
Mohammad

(10) Patent No.: US 7,760,576 B2
(45) Date of Patent: Jul. 20, 2010

(54) SYSTEMS AND METHODS FOR LOW POWER, HIGH YIELD MEMORY

(75) Inventor: Baker Mohammad, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 93 days.

(21) Appl. No.: 12/036,554

(22) Filed: Feb. 25, 2008

(65) Prior Publication Data
US 2009/0122620 A1 May 14, 2009

Related U.S. Application Data

(60) Provisional application No. 60/986,378, filed on Nov. 8, 2007.

(51) Int. Cl.
*G11C 8/00* (2006.01)
(52) U.S. Cl. .................. 365/226; 365/154; 365/206; 365/233.1
(58) Field of Classification Search .............. 365/154, 365/206, 226
See application file for complete search history.

(56) References Cited

U.S. PATENT DOCUMENTS 4,156,940 A  5/1979  Hollingsworth et al.
7,245,521 B2  7/2007  Mori et al.
7,292,495 B1*  11/2007  Kenkare et al. ............. 365/226
7,324,368 B2  1/2008  Wang et al.
2002/0159312 A1*  10/2002  Kasai et al. ................. 365/200
2005/0281106 A1*  12/2005  Han et al. .................... 365/205
2007/0030741 A1*  2/2007  Nii et al. ................. 365/189.11
2007/0206404 A1*  9/2007  Yamagami .................. 365/154

FOREIGN PATENT DOCUMENTS

EP    0345065    12/1989

OTHER PUBLICATIONS

International Search Report—PCT/US08/082852, Internatioan Search Authority-European Patent Office—Feb. 12, 2009.
Written Opinion—PCT/US08/082852, International Search Authority—European Patent Office—Feb. 12, 2009.

* cited by examiner

*Primary Examiner*—Hoai V Ho
(74) *Attorney, Agent, or Firm*—Peter Michael Kamarchik; Nicholas J. Pauley; Sam Talpalatsky

(57) ABSTRACT

A system for low power, high yield memory is described. The system includes a memory cell configured to receive a memory supply voltage. The system further includes a memory supply voltage control circuit configured to modify the memory supply voltage from a first memory supply voltage level to a second memory supply voltage level for a write to the memory cell.

18 Claims, 13 Drawing Sheets

SYSTEMS AND METHODS FOR LOW POWER, HIGH YIELD MEMORY

CROSS-REFERENCE TO RELATED APPLICATION

This application claims priority to U.S. Provisional Patent Application No. 60/986,378 filed Nov. 8, 2007, entitled "Systems and Methods for High Yield, Low Power Memory Design," the entirety of which is hereby incorporated by reference.

FIELD OF THE DISCLOSURE

Embodiments of the inventive concepts disclosed herein relate generally to the field of data processing systems. For example, embodiments of the inventive concepts disclosed herein relate to systems and methods for low power, high yield memory.

BACKGROUND

Memory (e.g., cache) can have a prevalent impact on performance of computing devices. For example, memory may impact the area, power usage, timing, yield, and scheduling of the processor. Dynamic Random Access Memory's (DRAM) primary emphasis on density rather than speed can make the performance gap between processor and main memory even greater. In addition, process scaling with the ability to double the number of transistors in each generation makes it possible for on chip memory to almost double in each generation, further expanding the performance gap. As a result of the ever-increasing gap between processor frequencies and DRAM access times, processors have steadily been using more on-die static random access memory (SRAM) to meet performance targets. Presently, SRAM arrays are in over 70% of devices and use 50% of the chip area.

One problem with increased usage of SRAM in computing devices is that accesses to such memory incurs power usage that may affect the battery life of the computing device. One problem in decreasing power usage of the SRAM includes a decreased access success rate of the memory.

SUMMARY OF THE DISCLOSURE

A system for low power, high yield memory is described. In one embodiment, the system includes a memory cell configured to receive a memory supply voltage. The system further includes a memory supply voltage control circuit configured to modify the memory supply voltage from a first memory supply voltage level to a second memory supply voltage level for a write to the memory cell. In another embodiment, the system may include a control circuitry to modify the wordline (WL) voltage controlling the pass gate of the memory cell from a first wordline voltage level to a second wordline voltage level to alter static noise margin (SNM) of the memory.

This illustrative embodiment is mentioned not to limit or define the inventive concepts disclosed herein, but to provide examples to aid understanding thereof. Illustrative embodiments are discussed in the Detailed Description, and further description of the inventive concepts disclosed herein is provided there. Advantages offered by various embodiments of this inventive concepts disclosed herein may be further understood by examining the specification and claims.

BRIEF DESCRIPTION OF THE DRAWINGS

These and other features, aspects, and advantages of the present inventive concepts disclosed herein are better understood when the following Detailed Description is read with reference to the accompanying drawings, wherein.

DETAILED DESCRIPTION

Throughout the description, for the purposes of explanation, numerous specific details are set forth in order to provide a thorough understanding of the inventive concepts disclosed herein. It will be apparent, however, to one skilled in the art that the inventive concepts disclosed herein may be practiced without some of these specific details. In other instances, well-known structures and devices are shown in block diagram form to avoid obscuring the underlying principles of the inventive concepts disclosed herein.

Embodiments of the inventive concepts disclosed herein relate to systems and methods for low power, high yield memory. In one embodiment, a memory (e.g., SRAM) includes static voltage scaling. For example, a wordline voltage may be scaled for a write to a memory cell and the voltage of the memory cell (Vddmem) may be scaled during a read from the memory cell. The amount of voltage scaling may be based on usage models and process corners. Voltage scaling may improve/increase static noise margin (SNM) of the memory, hence enhancing yield.

In one embodiment wherein the memory is SRAM, an SRAM includes level shifters/voltage scaling circuits configured to change the wordline (WL) and bitline (BL) voltage level of the SRAM to reduce the minimum voltage required to achieve cell stability during a read from an SRAM cell. Reducing the WL and BL voltage may reduce the power used by the SRAM during a read. In addition, the level shifter/voltage scaling circuits may be configured to be switched on and off such that the WL and BL voltages may be reduced for low power applications or during battery preservation or the WL and BL voltages may be maintained at original levels for high power applications or when power conservation is not important. For example, an embedded processor for mobile devices (e.g., cellular telephones) may support a high performance application like H.264 or High Speed Downlink Packet Access (HSDPA) wherein performance is important. An embedded processor may then play an MP3 file where power efficiency may be more important than performance.

To minimize impact to chip area, complexity, and timing, a single voltage supply may be used by the SRAM, including the level shifter/voltage scaling circuits.

Conventional SRAM Cell

Figure 1:
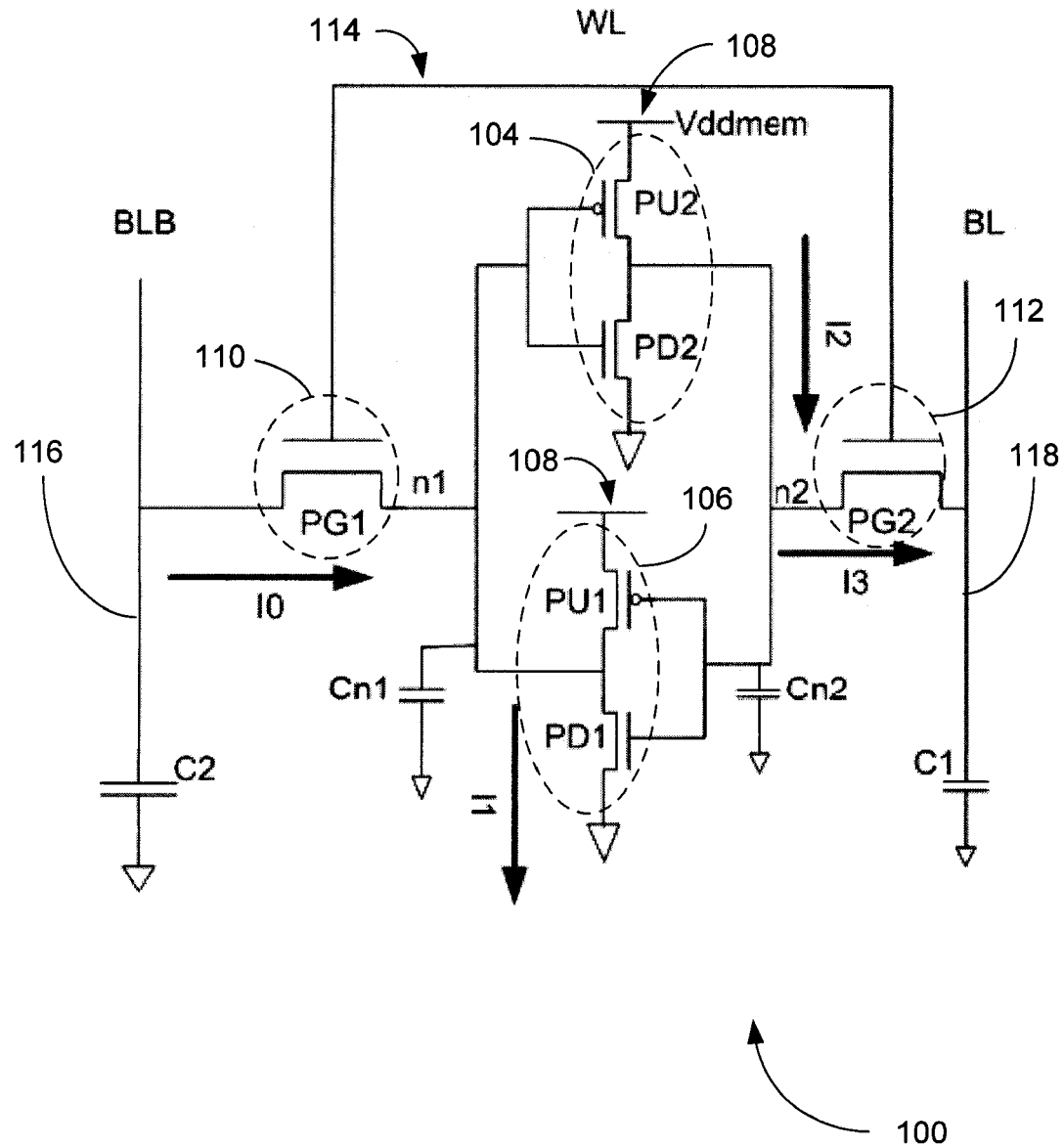
FIG. 1 is a prior art schematic illustrating a conventional six transistor SRAM cell.

FIG. 1 is a prior art schematic illustrating a conventional six transistor (6T) SRAM cell 100. While the inventive concepts are described as being included in SRAM, the inventive concepts may be included in other types of memory including, but not limited to, SDRAM. The SRAM cell 100 includes two transistor pairs 104, 106 to connect the SRAM cell to Vddmem 108 and ground. Transistors PG1 110 and PG2 112 may be controlled by wordline (WL) voltage 114 and are used to access the memory cell 100 during read or write.

For the 6T SRAM cell 100, a plurality of factors may be of importance, including, but not limited to:

1. minimized cell area to achieve high density memory, reduce power, and reduce cost of the chip;
2. cell stability with minimum voltage to prevent reduced data access and retention success due to data corruption;
3. good soft error immunity;
4. high cell read current to minimize access time;
5. minimum word line pulse during write to save on power (by reducing bitline swing); and
6. low leakage current to enable long battery life both during active and standby.

Many interactions may exist between the different factors. For example, in one embodiment, to obtain good stability, small access time, and good soft error immunity, big transistor sizes (104, 106, 110, and 112) may be used, which may result in larger area usage and increased leakage.

Static Noise Margin

Static Noise Margin (SNM) is the noise margin provided by a circuit in excess of the ambient noise levels in the SRAM. Thus, SNM may be the difference between the voltage threshold for switching to a logic 1 or a logic 0 and the ambient voltage incidentally in the circuit. Increasing the SNM improves yield of the memory by creating a larger voltage difference to be created by ambient voltage in order to have a switch of a logic device to a false logic state. The SNM may be improved in an SRAM cell by increasing the cell ratio (CR). The CR is represented in equation 1 below:

$$CR = \frac{(W_{PD}/L_{PD})}{(W_{PG}/L_{PG})} \quad (1)$$

wherein W is the width and L is the length of the channel of pull down transistor PD1/pull up transistor PU1 106 and pass gate transistor PG1 for a write (FIG. 1) to the SRAM cell 100 or pull down transistor PD2/pull up transistor PU2 104 and pass gate transistor PG2 112 for a read (FIG. 1) from the SRAM cell 100. Improving SNM for the SRAM cell 100 through increasing CR may include using a smaller transistor for PG1 110, which may increase the access time from the SRAM cell 100.

Improving the write margin to the SRAM cell 100 through increasing the pull up ratio (PU), as illustrated in equation (1.5):

$$PU = \left(\frac{W}{L}\right)PG \bigg/ \left(\frac{W}{L}\right)PU \quad (1.5)$$

may include using a bigger transistor for PG1 110, which may worsen the noise margin for a read from the SRAM cell 100.

In one embodiment, for the SRAM cell 100 to function properly during a write to the SRAM at all process corners, voltage, and temperature (PVT), the current through PD1 is greater than or equal to the current through PG1 110 (i.e., I1(linear)>=I0(saturation)). In addition, for a read from the SRAM cell 100, the current through PG2 112 is greater than or equal to the current along node n2 before PG2 112 (i.e., I3(linear)>=I2(saturation)). Equation 2 shows the relationship for write stability between I0 and I1, wherein I1(linear)>=I0(saturation):

$$\mu_n C_\infty \left(\frac{W_{PD}}{L_{PD}}\right)\left(V_{ddmem} - V_t - \frac{1}{2}V_{n1}\right)V_{n1} \geq \quad (2)$$
$$\frac{\mu_n C_\infty}{2}\left(\frac{W_{PG}}{L_{PG}}\right)(V_{ddm1} - V_{n1} - V_t)^a$$

Equation 3 shows the relationship for read stability between I2 and I3, wherein I3(linear)>=I2(saturation).

$$\mu_n C_\infty \left(\frac{W_{PG}}{L_{PG}}\right)\left(V_{ddm1} - V_{bt} - V_{tn} - \frac{1}{2}V_{n2}\right)V_{n2} \geq \quad (3)$$
$$\frac{\mu_p C_\infty}{2}\left(\frac{W_{PU}}{L_{PU}}\right)(0 - V_{ddmem} - V_{tp})^a$$

In one embodiment, equations 2 and 3 are used as the baseline to find transistor sizes for SRAM cell 100. Empirical data from silicon may further be used to tune the cell sizes and layout in order to obtain a robust memory cell.

Voltage Scaling Circuits for Wordline and Memory Supply Voltages for Memory

Figure 2:
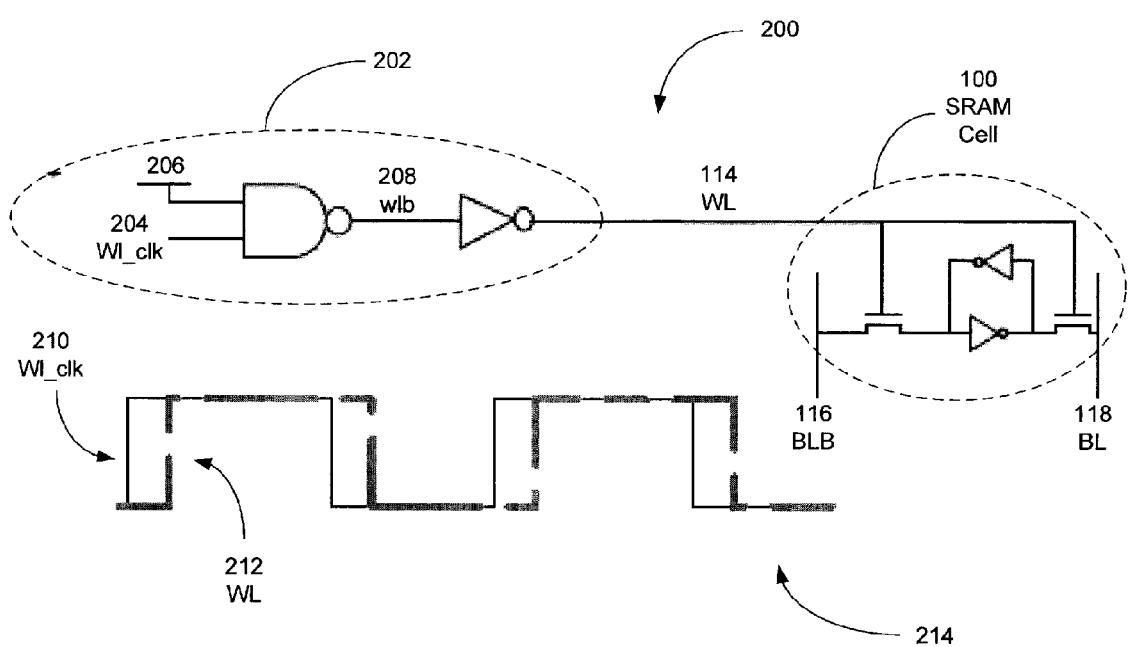
FIG. 2 is a prior art schematic illustrating a conventional circuit for outputting a WL voltage and a waveform diagram illustrating the output waveform of the conventional circuit.

FIG. 2 is a prior art schematic 200 illustrating a conventional circuit 202 for outputting a WL (or BL) voltage 114 and a waveform diagram 214 illustrating the output waveform of the circuit 202. The conventional circuit 202 includes a NAND gate configured to receive the original Wl_clk signal 204 and the SRAM voltage 206 and output an inverse WL (wlb) voltage 208. Voltage wlb 208 is then delayed or inverted by the inverter of circuit 102 to create WL 114. The waveforms 210 and 212 illustrate that the voltage difference between the input Wl_clk 204 and WL 114 is negligible and a delay may exist between the waveforms as a result of the circuit 202.

Figure 3:
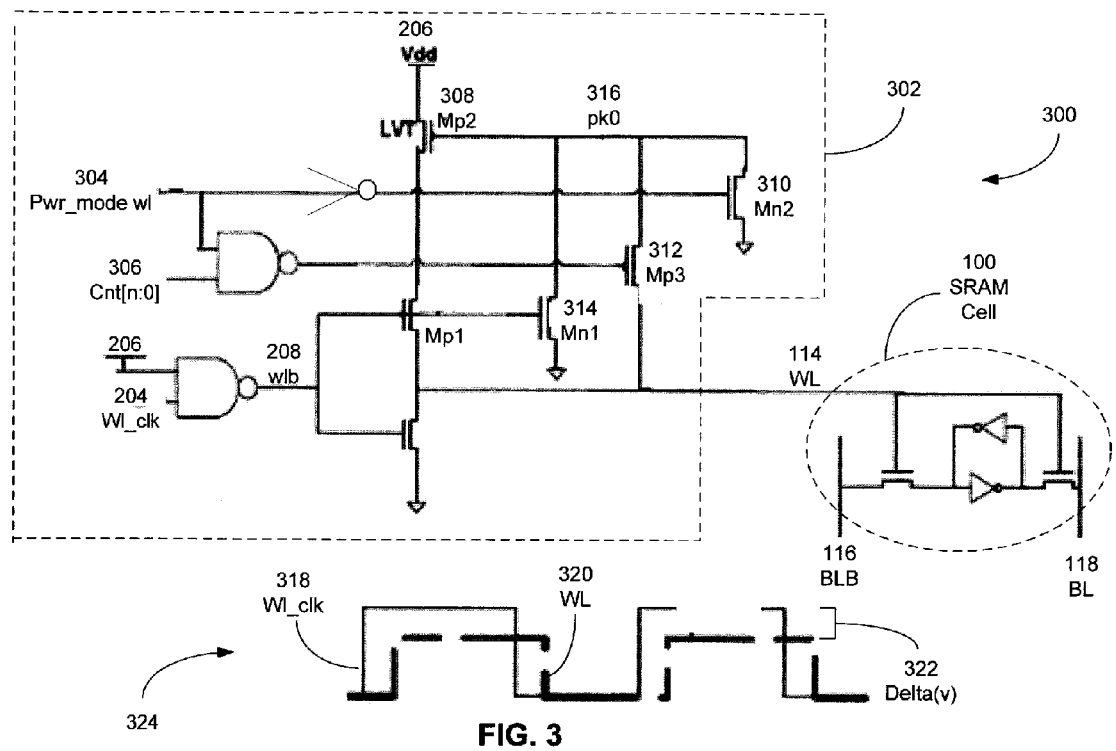
FIG. 3 is a schematic illustrating an exemplary circuit for scaling a WL voltage and a waveform diagram illustrating the output waveform of the circuit.

FIG. 3 is a schematic 300 illustrating an exemplary circuit 302 for scaling a WL (or BL) voltage 114 and a waveform diagram 324 illustrating the output waveform of the circuit 302. In one embodiment, the circuit 302 includes the NAND gate of circuit 202 in FIG. 2 to output wlb 208. The circuit 302 may further include the inverter of the circuit 202, including pull up transistor Mp1. The circuit 302 may also include transistors 308-316 to control the voltage Vdd 206 to the transistor Mp1.

The circuit 302 may further include a pwr_mode wl input signal 304 to enable or disable the circuit 302. The value of the signal 304 may be based on the PVT corner or program control of the SRAM. When pwr_mode wl 304 is a logic 1, then circuit 302 functions the same as the conventional circuit 202 in FIG. 2, wherein the voltage level of WL 114 reaches the voltage level of Wl_clk 204. When pwr_mode wl 304 is a logic 0, then circuit 302 is activated so as to scale the voltage level of WL 114.

When circuit 302 is configured to scale the voltage level of WL 114 (i.e., pwr_mode wl 304 equals logic 0), the cnt[n:0] signals 306 determine the voltage level of WL 114 by adjusting the size of transistor Mp3 312. Changing the size of transistor Mp3 312 changes the speed with which a charge will be transferred from the WL 114 node into the pk0 node 316 through transistor Mp3 312. Increasing the transfer speed of the charge decreases the voltage level of WL 114. In one embodiment, the nMOS transistor Mp2 308 pre-conditions the pk0 node 316 during normal operation mode to enable the pull up path to Vdd 206. In one embodiment, both transistors Mn1 314 and Mn2 310 may be minimum size transistors having a minimum impact on timing.

Waveforms 318 and 320 illustrate the scaling of the WL voltage when pwr_mode wl 304 is a logic 0. As in the waveforms of FIG. 2, a delay exists between waveform 318 and waveform 320. Delta(v) 322 is the voltage savings between Wl_clk input signal 318 and WL output signal 320 by scaling the WL voltage 114 during a read. The values of cnt[n:0] 306 determine the size of delta(v) 322.

Figure 4:
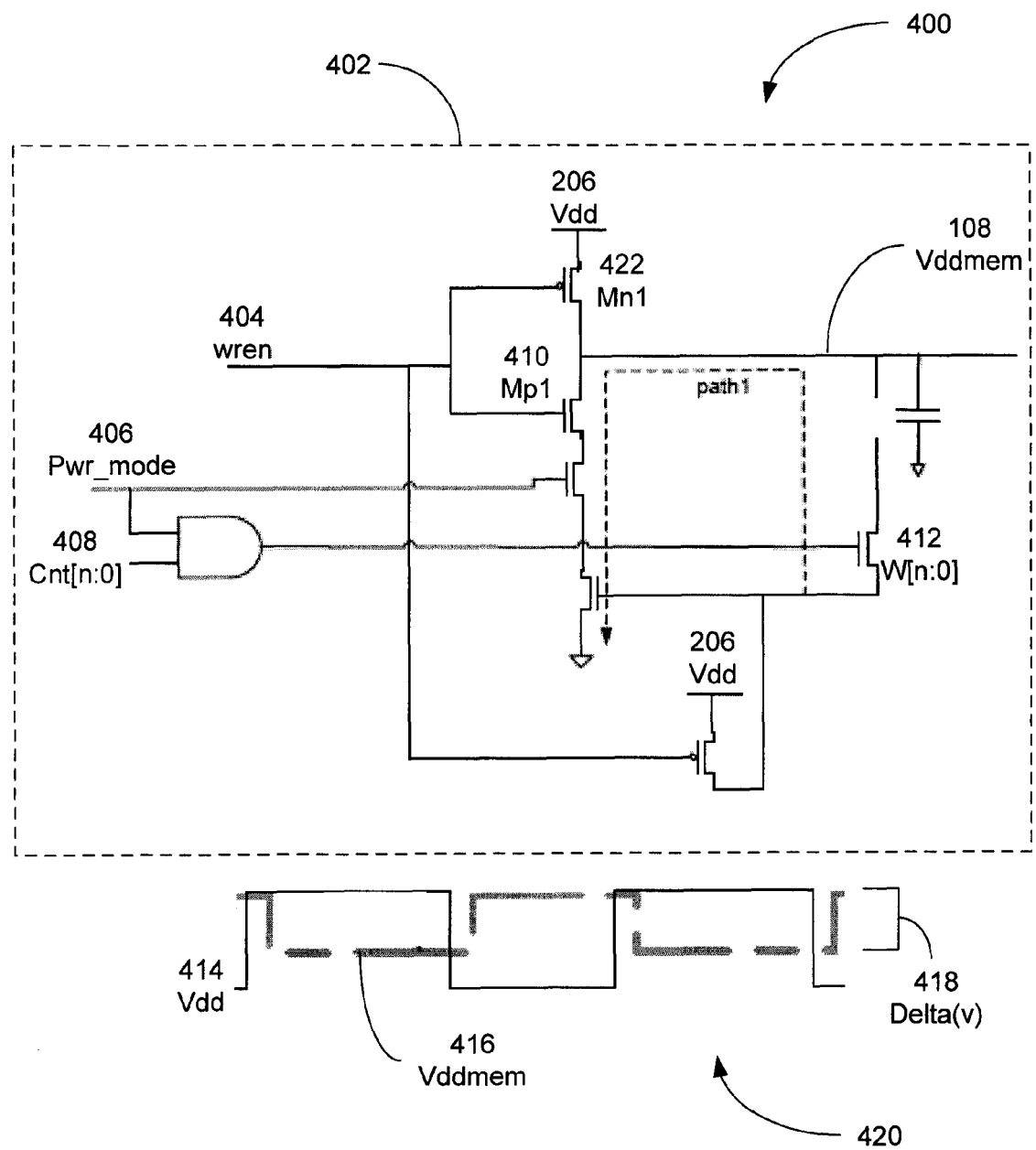
FIG. 4 is a schematic illustrating an exemplary circuit for scaling a Vddmem voltage and a waveform diagram illustrating the output waveform of the circuit.

FIG. 4 is a schematic 400 illustrating an exemplary circuit 402 for scaling the voltage of Vddmem 108 of the SRAM cell 100 of FIG. 1 and a waveform diagram 420 illustrating the output waveform of the circuit 402. Vddmem 108 may be set to Vdd 206 during a read (when wren 404 is set to a logic 0) and scaled during a write (when wren 404 is set to a logic 1). When wren 404 equals a logic 0, wren activates transistor Mn1 422, thus setting Vddmem 108 to Vdd 206. When wren 404 equals a logic 1, wren 404 activates transistor Mp1 410 and deactivates transistor Mn1 422. Further, when wren 404 equals a logic 1, pwr_mode 406 is configured to enable the voltage scaling for circuit 402 (pwr_mode 406 equals a logic 1) or disable the voltage scaling for circuit 402 (pwr_mode 406 equals a logic 0). When pwr_mode 406 and wren 404 are equal to a logic 1, then cnt[n:0] signals 408 adjust the voltage level of Vddmem 108 by controlling variable transistor W[n:0] 412. Changing the capacitance of transistor W[n:0] 412 may change the voltage level of Vddmem 108.

Voltage scaling of Vddmem 108 by circuit 402 includes lowering the voltage level of Vddmem 108 when Vdd 206 is a logic level 1. Waveform 414 illustrates the waveform of input Vdd 206. Waveform 416 illustrates the voltage scaling waveform of Vddmem 108, wherein delta(v) 418 is the voltage amount Vddmem 416 is lowered during a write (when Vdd 206 is a logic 1).

For the exemplary circuits in FIGS. 3-4, the minimum allowable voltage (Vddmin) for successful access of the memory is reduced. For example, when Vdd is a logic 1 for circuits 302, 402 of FIGS. 3 and 4, the Vddmem voltage level may be lower than the Vdd voltage level and still allow for successful access of the memory. In one embodiment, Vddmin is 0.8 v as compared to 1.0 v for Vdd. The exemplary circuits thus increase the SNM and the write margin of memory. In addition, the circuits offer full controllability and programmability. Hence, the controllability may be used to tune memory behavior to match silicon via an on chip control circuit. A simple ring oscillator delay or leakage monitor may be used to tune the circuit based on a transistor's parameters.

In one embodiment, both the WL and Vddmem circuits use a delay element to tune the value of the new voltage level. As a result, the granularity and level of the circuit is limited by the speed of the delay element. In addition, the speed of the memory access may be reduced by WL voltage reduction. Hence, the timing impact may be reduced by enabling the control on the fast corners where the SNM is most likely to affect the cell.

Exemplary Memory with Voltage Scaling Circuits

Figure 5:
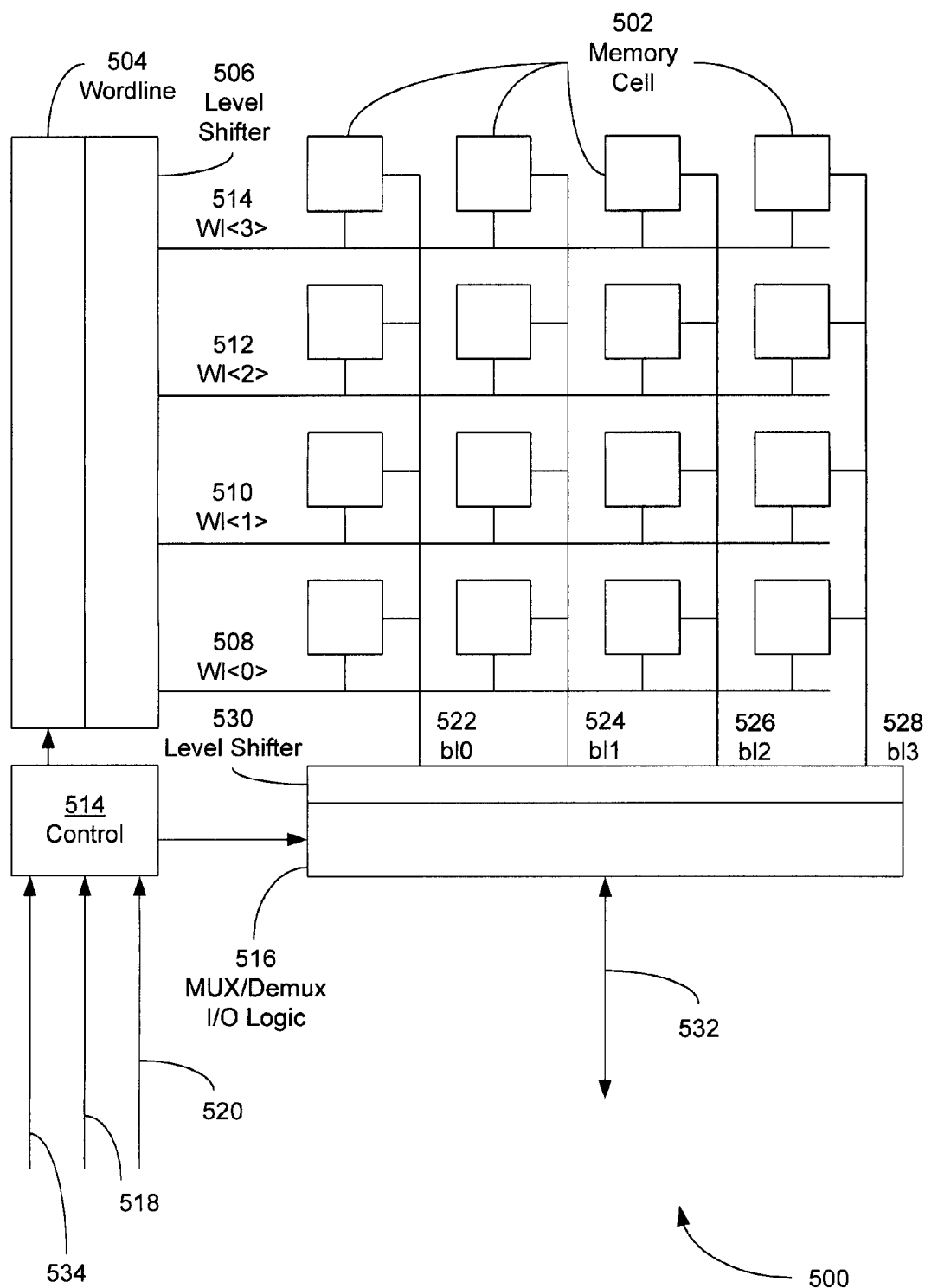
FIG. 5 is a diagram illustrating an exemplary memory array including a level shifter for the wordline voltage, a level shifter for Vddmem, and a level shifter for the bitline voltage received from the memory cells.
Figure 6:
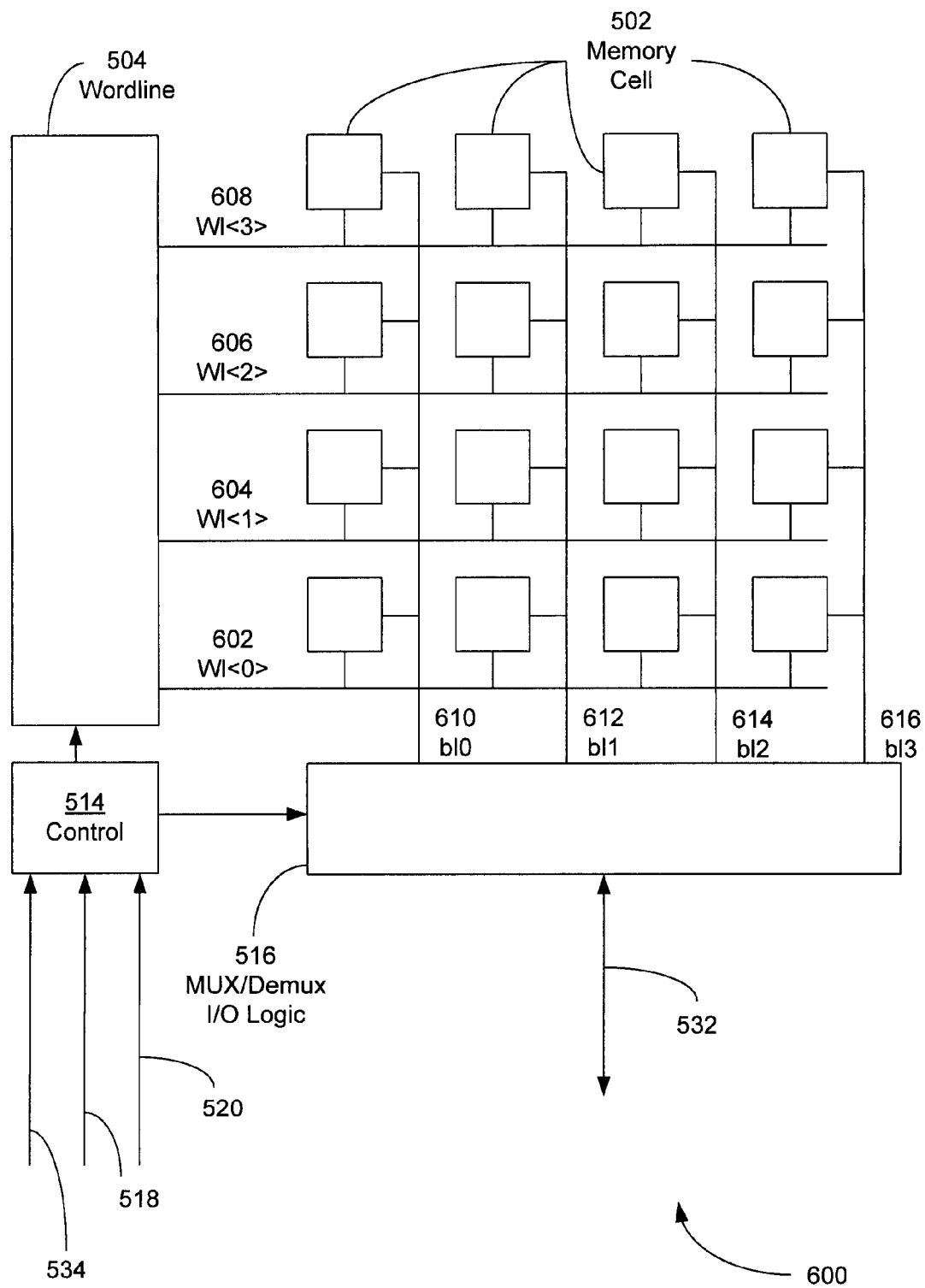
FIG. 6 is a diagram illustrating an exemplary memory array including a level shifter for Vddmem and not including a level shifter for the wordline voltage or the bitline voltage.

FIGS. 5-6 are diagrams illustrating exemplary memory including level shifters/voltage scaling circuits. FIG. 5 is a diagram illustrating a memory 500 including level shifter/voltage scaling circuit 302 of FIG. 3 for the wordline logic 504 and MUX/Demux logic 516 and level shifter/voltage scaling circuit 402 of FIG. 4 for the memory cells 502. Hence, the memory 500 performs voltage scaling of WL and BL voltages during reads and Vddmem during writes. FIG. 6 is a diagram illustrating a memory 600 including level shifter/voltage scaling circuit 402 of FIG. 4 for the memory cells 502 without a level shifter/voltage scaling circuit 302 of FIG. 3 for the wordline logic 504 and MUX/Demux logic 516. Hence, the memory 600 performs voltage scaling of Vddmem during writes.

Referring to the diagram of FIG. 5, memory 500 includes memory cells 502 (e.g., a 6T SRAM cell). The memory cells 502 include the level shifter/circuit 402 to voltage scale Vddmem of the memory cells. The memory 500 further includes a wordline logic 504 which includes a level shifter/circuit 506, such as circuit 302 in FIG. 3, to scale the voltage on wordlines 508-514. Wordline logic 504 is configured to select a wordline (row) of the memory array from the control received from control 514. For example, if the computing device is to write to the top right memory cell of the memory cells 502, then wordline logic 504 selects Wl<3> 514 to access the row including the intended memory cell.

Control 514 may receive a clock signal 534, memory address 518 of the memory cell to be accessed by the computing device, and a Read/Write signal 520 to determine whether the device is to write to or read from the memory cell. In addition to sending a control signal to wordline logic 504, control 514 is configured to send a control signal to MUX/Demux Input/Output logic 516.

Logic 516 is configured to receive the data 532 to be written to the memory 500 and send the data 532 to be read from the memory 500. Logic 516 is configured to select the bitline 522-528 including the memory cell 502 to be accessed. For example, if the top right memory cell of memory cells 502 is to be accessed, then the logic 516 selects bl3 528. Logic 516 further determines whether data 532 is to be received or sent depending on whether a read or write is to be performed. In memory 500, logic 516 includes level shifters/circuits 530. In one embodiment, the level shifters/circuits 530 may be the circuit 302 for scaling the BL voltages.

Referring to the diagram of FIG. 6, memory 600 is similar to memory 500 in the diagram of FIG. 5, except the wordline logic 504 and MUX/Demux logic 516 do not include level shifters/circuits 506 or 530. Instead, voltage levels may be reduced before being received by logic 504 or 516, which uses the voltage to create wordlines 602-608 and bitlines 610-616. For example, a power rail to be received by logic 504 and 516 may be set to 0.8 v instead of 1.0 v. In one embodiment, a separate voltage divider reduces the voltage received by logic 504 and 516 to create the WL and BL signals (e.g., from 1.0 v to 0.8 v). Hence, WL and BL voltage levels for logic 1 are less than the logic 1 voltage level for Vdd during both a read and write. The power rail carrying the reduced voltage may further be used by other on-chip components. Hence, in one embodiment, WL and BL are the same voltage level as other components.

The memory cells 502 still include the level shifter/circuit 402 to voltage scale Vddmem of the memory cells. Hence, the SNM of the memory cells 502 is maintained at a high level. In the embodiment, Vddmem may be coupled to only the memory cells 502. One advantage is that the circuit (including the wordline and bitline) minus the memory array may use a common reduced voltage level, which may be less than the voltage level used by the memory array. The memory array remains at a higher voltage level, thus including the voltage scaling circuits, as determined by cell stability.

Example Methods of Operation of the Exemplary Memory

Figure 7:
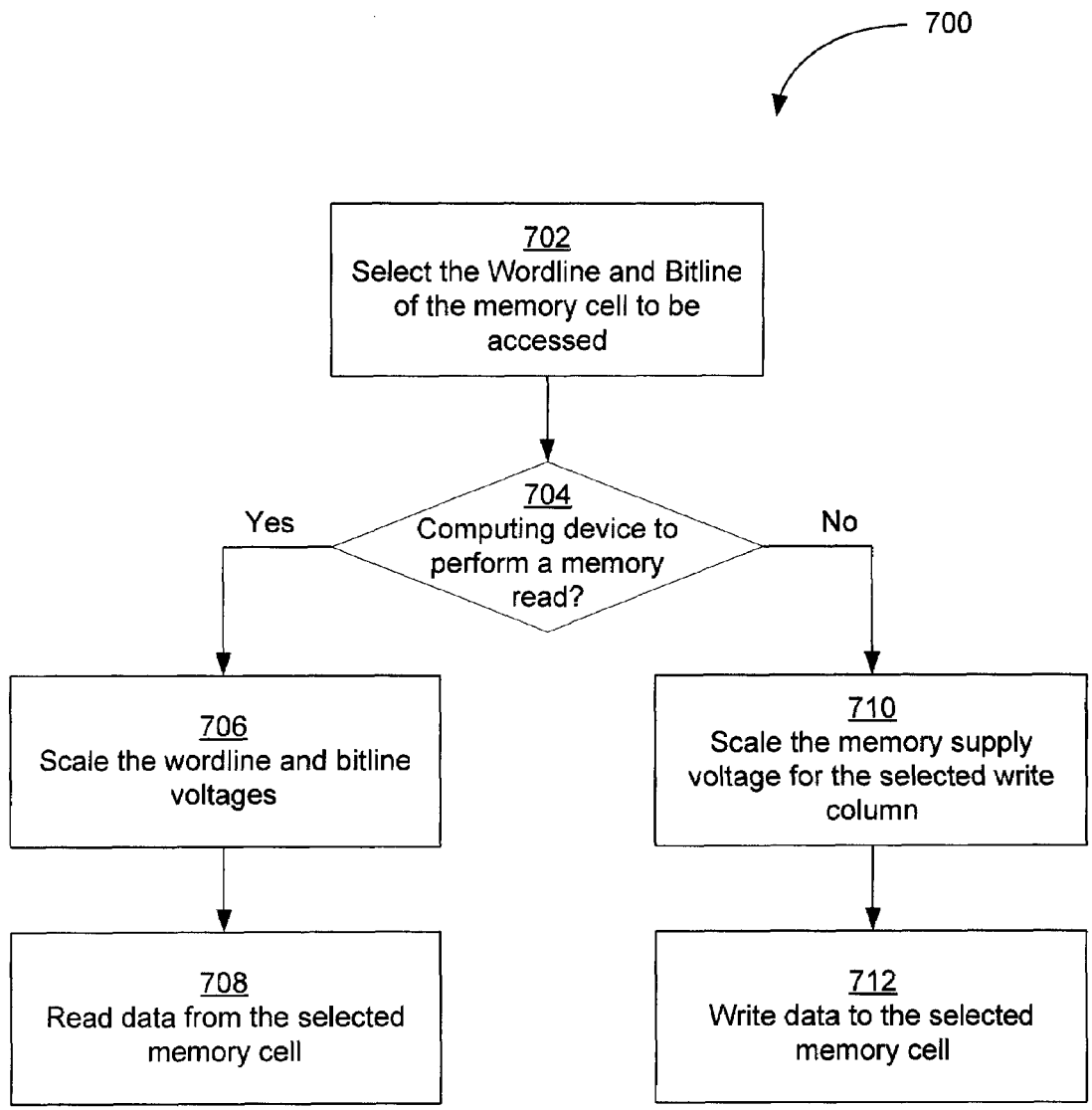
FIG. 7 is a flowchart illustrating a method for selectively voltage scaling the wordline and bitline voltages and the supply voltage Vddmem for the memory of FIG. 5.
Figure 8:
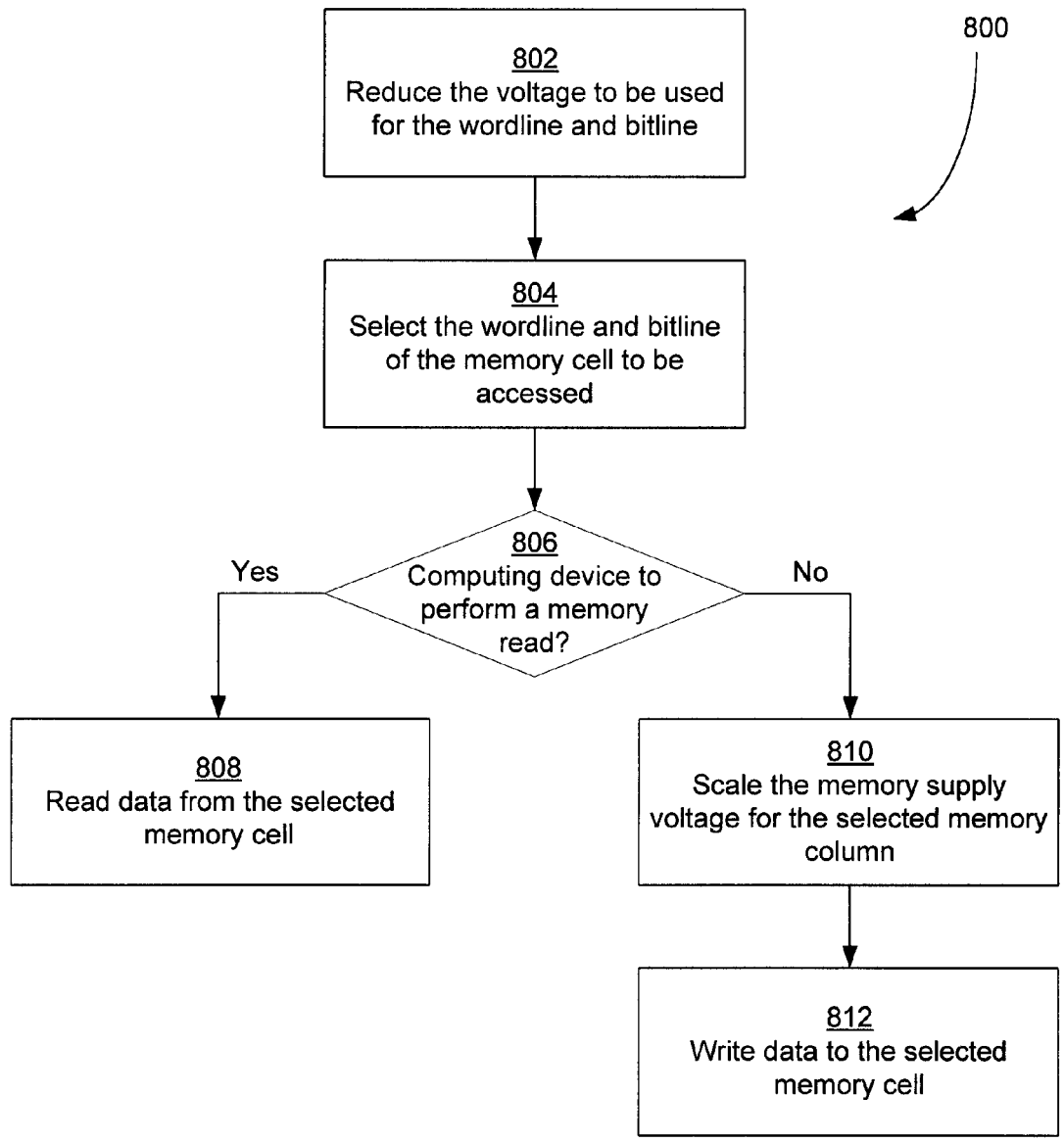
FIG. 8 is a flowchart illustrating a method for voltage scaling the wordline and bitline voltages and selectively voltage scaling the supply voltage Vddmem for the memory of FIG. 6.

FIGS. 7-8 are flowcharts illustrating example methods of operation of the exemplary memory of FIGS. 5-6, respectively. The flowchart of FIG. 7 illustrates a method for selectively voltage scaling the WL and BL voltages and the supply voltage Vddmem for the memory 500 of FIG. 5. Beginning at 702, the wordline logic 504 selects a wordline 508-514 and the logic 516 selects a bitline 522-528 to access the memory cell addressed by Addr<N:0> 518. Proceeding to 704, logic 516 determines from read/write signal 520 if the computing device is to perform a read from the selected memory cell. If a read is to be performed, then the wordline logic 504 scales the WL voltage and the logic 516 scales the BL voltage in 706. In one embodiment of scaling during a read, the level shifters 506 and 530 include the circuit 302 of FIG. 3 to scale the WL and BL voltages. The pwr_mode wl 304 is set to a logic 1, and the WL 114 or BL is scaled to the level determined by cnt[n:0] 306. Upon scaling the WL and BL voltages, the memory 500 accesses the selected memory cell and outputs data 532 in 708.

If a read is not to be performed (i.e., a write is to be performed) in 704, then the circuit 402 (FIG. 4) of the memory cell scales the supply voltage Vddmem in 710. In one embodiment of scaling during a write, each memory cell of the memory cells 502 may be coupled to a circuit 402 in FIG. 4 for scaling Vddmem 108. Hence, wren 404 is a logic 1 (a write) and pwr_mode 406 is a logic 1 to enable scaling. Cnt[n:0] 408 then determines the scaled voltage level of Vddmem 108 by controlling the variable transistor W[n:0] 412. Proceeding to 712, the memory 500 writes data 532 to the selected memory cell using the scaled Vddmem 108 for the selected memory cell.

The flowchart of FIG. 8 illustrates a method for selectively voltage scaling the supply voltage Vddmem for the memory 600 of FIG. 6. Beginning at 802, the memory 500 may reduce the voltage to be used for the WL and BL via, e.g., a voltage divider. Logic 504 and 516 may thus output WL and BL voltages via a conventional circuit 202 in FIG. 2 using the reduced voltage level. As a result, in one embodiment of the memory, the WL and BL voltages are less than Vdd when Vdd is a logic 1, including during a memory write. As a result of the embodiments, the noise margins during a read and a write are kept at acceptable levels through voltage scaling Vddmem 108 at the memory cells 502. Proceeding to 804, the wordline logic 504 selects a wordline 602-608 and the logic 516 selects a bitline 610-616 to access the memory cell addressed by Addr<N:0> 518.

Proceeding to 806, logic 516 determines from read/write signal 520 if the computing device is to perform a read from the selected memory cell. If a read is to be performed, then the memory 600 accesses the selected memory cell and outputs data 532 in 808. Therefore, Vdd on the memory cell is not scaled during read.

If a read is not to be performed (i.e., a write is to be performed) in 806, then the circuit 402 (FIG. 4) coupled to the selected memory cell scales the supply voltage Vddmem in 810. In one embodiment of scaling during a write, each memory cell of the memory cells 502 may be coupled to a circuit 402 in FIG. 4 for scaling Vddmem 108. Hence, wren 404 is a logic 1 (a write) and pwr_mode 406 is a logic 1 to enable scaling. Cnt[n:0] 408 then determines the scaled voltage level of Vddmem 108 by controlling the variable transistor W[n:0] 412. Proceeding to 812, the memory 600 writes data 532 to the selected memory cell 502 using the scaled Vddmem 108 for the selected memory cell 502.

Example Devices Including the Above Described Features

Low power, high yield memory as described above may be included in any processing devices including a memory, such as SRAM. While low power, high yield memory is illustrated as being included in a digital signal processor, low power, high yield memory may be external to the processor in the computing device (e.g., separate random access memory). The general diagrams of FIGS. 9-13 illustrate example devices that may incorporate low power, high yield memory for voltage scaling during memory reads and writes.

Figure 9:
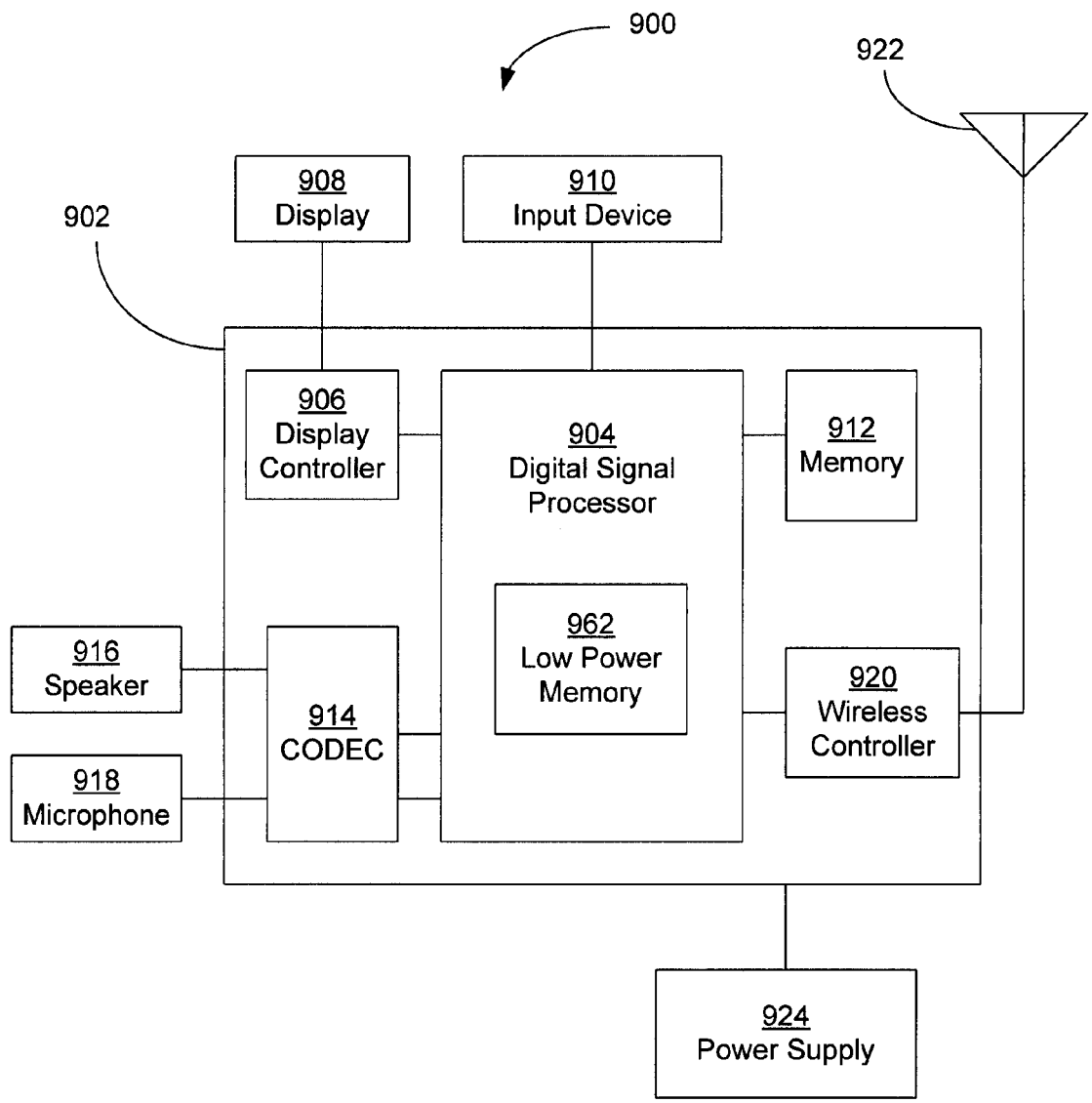
FIG. 9 is a general diagram illustrating an example portable communication device that may include a low power, high yield memory.

FIG. 9 is a diagram illustrating an exemplary embodiment of a portable communication device 900. As illustrated in the general diagram of FIG. 9, the portable communication device includes an on-chip system 902 that includes a digital signal processor (DSP) 904. The general diagram of FIG. 9 also shows a display controller 906 that is coupled to the digital signal processor (DSP) 904 and a display 908. Moreover, an input device 910 is coupled to the DSP 904. As shown, a memory 912 is coupled to the DSP 904. Additionally, a coder/decoder (CODEC) 914 may be coupled to the DSP 904. A speaker 916 and a microphone 918 may be coupled to the CODEC 914.

The general diagram of FIG. 9 further illustrates a wireless controller 920 coupled to the digital signal processor 904 and a wireless antenna 922. In a particular embodiment, a power supply 924 is coupled to the on-chip system 902. Moreover, in a particular embodiment, as illustrated in FIG. 9, the display 926, the input device 930, the speaker 916, the microphone 918, the wireless antenna 922, and the power supply 924 are external to the on-chip system 902. However, each is coupled to a component of the on-chip system 902. In a particular embodiment, the DSP 904 includes a low power, high yield memory 962 as described in FIGS. 5 and 6 in order to reduce power consumption during memory accesses. In another embodiment, memory 912 may be low power, high yield memory as described in FIGS. 5 and 6.

Figure 10:
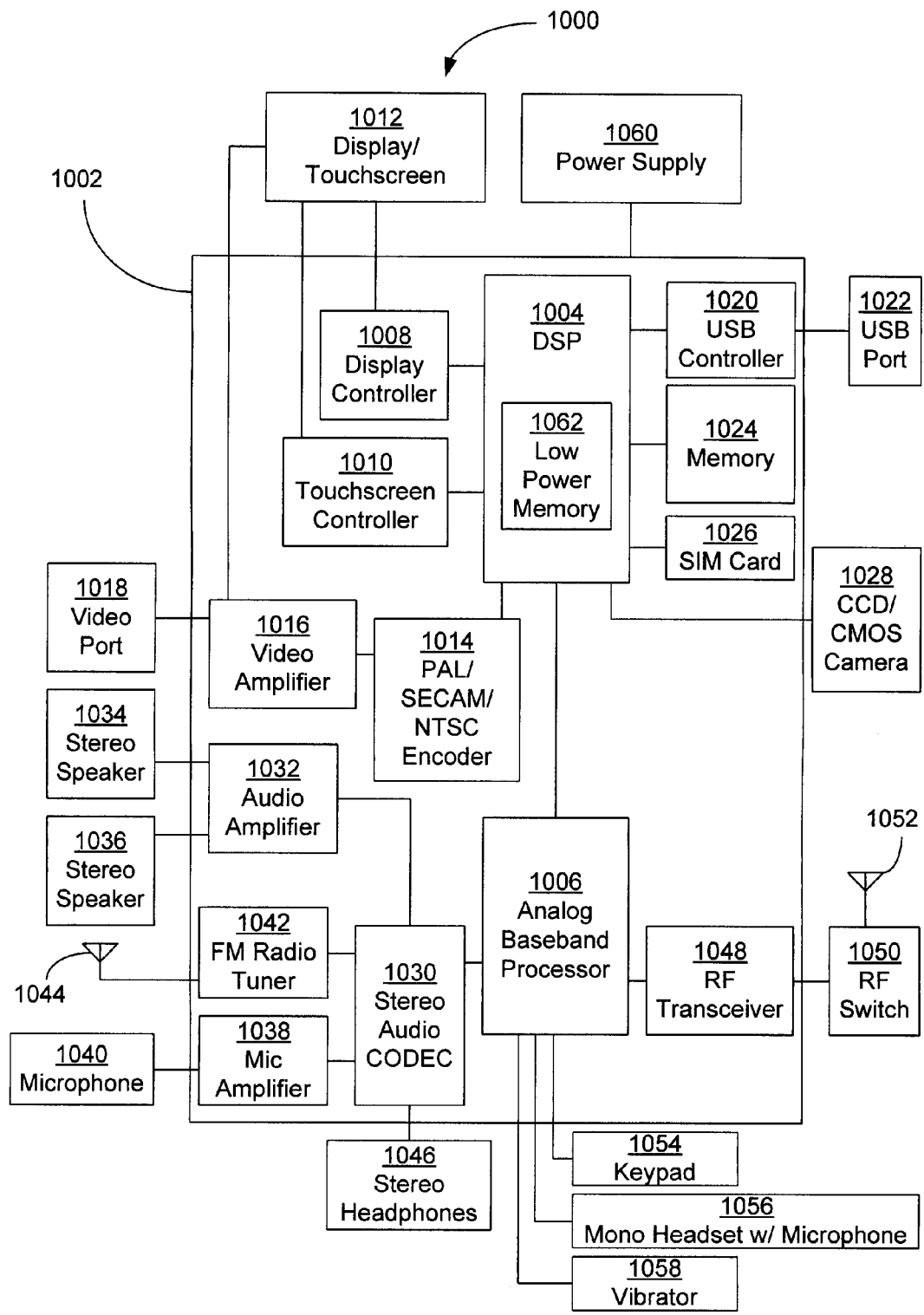
FIG. 10 is a general diagram illustrating an example cellular telephone that may include a low power, high yield memory.

FIG. 10 is a diagram illustrating an exemplary embodiment of a cellular telephone 1000. As shown, the cellular telephone 1000 includes an on-chip system 1002 that includes a digital baseband processor 1004 and an analog baseband processor 1006 that are coupled together. In a particular embodiment, the digital baseband processor 1004 is a digital signal processor. As illustrated in the general diagram of FIG. 10, a display controller 1008 and a touchscreen controller 1010 are coupled to the digital baseband processor 1004. In turn, a touchscreen display 1012 external to the on-chip system 1002 is coupled to the display controller 1008 and the touchscreen controller 1010.

The general diagram of FIG. 10 further illustrates a video encoder 1014, e.g., a phase alternating line (PAL) encoder, a sequential couleur a memoire (SECAM) encoder, or a national television system(s) committee (NTSC) encoder, is coupled to the digital baseband processor 1004. Further, a video amplifier 1016 is coupled to the video encoder 1014 and the touchscreen display 1012. Also, a video port 1018 is coupled to the video amplifier 1016. As depicted in the general diagram of FIG. 10, a universal serial bus (USB) controller 1020 is coupled to the digital baseband processor 1004. Also, a USB port 1022 is coupled to the USB controller 1020. A memory 1024 and a subscriber identity module (SIM) card 1026 may also be coupled to the digital baseband processor 1004. Further, as shown in the general diagram of FIG. 10, a digital camera 1028 may be coupled to the digital baseband processor 1004. In an exemplary embodiment, the digital camera 1028 is a charge-coupled device (CCD) camera or a complementary metal-oxide semiconductor (CMOS) camera.

As further illustrated in the general diagram of FIG. 10, a stereo audio CODEC 1030 may be coupled to the analog baseband processor 1006. Moreover, an audio amplifier 1032 may be coupled to the stereo audio CODEC 1030. In an exemplary embodiment, a first stereo speaker 1034 and a second stereo speaker 1036 are coupled to the audio amplifier 1032. A microphone amplifier 1038 may be also coupled to the stereo audio CODEC 1030. Additionally, a microphone 1040 may be coupled to the microphone amplifier 1038. In a particular embodiment, a frequency modulation (FM) radio tuner 1042 may be coupled to the stereo audio CODEC 1030. Also, an FM antenna 1044 is coupled to the FM radio tuner 1042. Further, stereo headphones 1046 may be coupled to the stereo audio CODEC 1030.

The general diagram of FIG. 10 further illustrates a radio frequency (RF) transceiver 1048 may be coupled to the analog baseband processor 1006. An RF switch 1050 may be coupled to the RF transceiver 1048 and an RF antenna 1052. A keypad 1054 may be coupled to the analog baseband processor 1006. Also, a mono headset with a microphone 1056 may be coupled to the analog baseband processor 1006. Further, a vibrator device 1058 may be coupled to the analog baseband processor 1006. The general diagram of FIG. 10 also shows a power supply 1060 may be coupled to the on-chip system 1002. In a particular embodiment, the power supply 1060 is a direct current (DC) power supply that provides power to the various components of the cellular telephone 1000. Further, in a particular embodiment, the power supply is a rechargeable DC battery or a DC power supply that is derived from an alternating current (AC) to DC transformer that is coupled to an AC power source.

As depicted in the general diagram of FIG. 10, the touchscreen display 1012, the video port 1018, the USB port 1022, the camera 1028, the first stereo speaker 1034, the second stereo speaker 1036, the microphone 1040, the FM antenna 1044, the stereo headphones 1046, the RF switch 1048, the RF antenna 1050, the keypad 1052, the mono headset 1056, the vibrator 1058, and the power supply 1060 may be external to the on-chip system 1002. In a particular embodiment, the digital baseband processor 1004 may include a multi-mode register file 1060 in order to store, e.g., branch prediction information when the register file 1060 is not in a first mode (not storing operands for an active thread). In a particular embodiment, the DSP 1004 includes a low power, high yield memory 1062 as described in FIGS. 5 and 6 in order to reduce power consumption during memory accesses. In another embodiment, memory 1024 may be low power, high yield memory as described in FIGS. 5 and 6.

Figure 11:
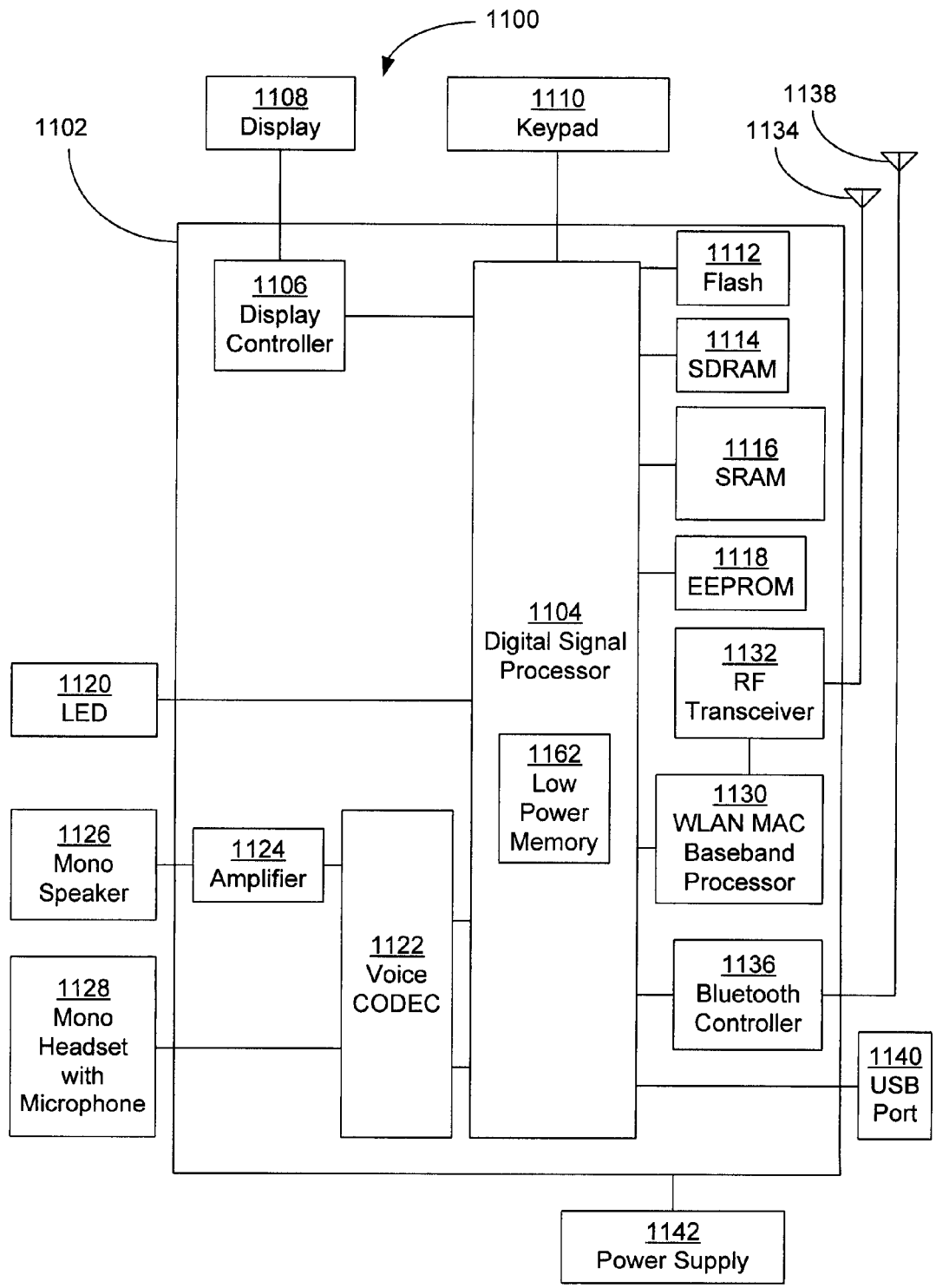
FIG. 11 is a general diagram illustrating an example wireless Internet Protocol telephone that may include a low power, high yield memory.

FIG. 11 is a diagram illustrating an exemplary embodiment of a wireless Internet protocol (IP) telephone 1100. As shown, the wireless IP telephone 1100 includes an on-chip system 1102 that includes a digital signal processor (DSP) 1104. A display controller 1106 may be coupled to the DSP 1104 and a display 1108 is coupled to the display controller 1106. In an exemplary embodiment, the display 1108 is a liquid crystal display (LCD). FIG. 11 further shows that a keypad 1110 may be coupled to the DSP 1104.

A flash memory 1112 may be coupled to the DSP 1104. A synchronous dynamic random access memory (SDRAM) 1114, a static random access memory (SRAM) 1116, and an electrically erasable programmable read only memory (EEPROM) 1118 may also be coupled to the DSP 1104. The general diagram of FIG. 11 also shows that a light emitting diode (LED) 1120 may be coupled to the DSP 1104. Additionally, in a particular embodiment, a voice CODEC 1122 may be coupled to the DSP 1104. An amplifier 1124 may be coupled to the voice CODEC 1122 and a mono speaker 1126 may be coupled to the amplifier 1124. The general diagram of FIG. 11 further illustrates a mono headset 1128 coupled to the voice CODEC 1122. In a particular embodiment, the mono headset 1128 includes a microphone.

A wireless local area network (WLAN) baseband processor 1130 may be coupled to the DSP 1104. An RF transceiver 1132 may be coupled to the WLAN baseband processor 1130 and an RF antenna 1134 may be coupled to the RF transceiver 1132. In a particular embodiment, a Bluetooth controller 1136 may also be coupled to the DSP 1104 and a Bluetooth antenna 1138 may be coupled to the controller 1136. The general diagram of FIG. 11 also shows that a USB port 1140 may also be coupled to the DSP 1104. Moreover, a power supply 1142 is coupled to the on-chip system 1102 and provides power to the various components of the wireless IP telephone 1100.

As indicated in the general diagram of FIG. 11, the display 1108, the keypad 1110, the LED 1120, the mono speaker 1126, the mono headset 1128, the RF antenna 1134, the Bluetooth antenna 1138, the USB port 1140, and the power supply 1142 may be external to the on-chip system 1102 and coupled to one or more components of the on-chip system 1102. In a particular embodiment, the DSP 1104 includes a low power, high yield memory 1162 as described in FIGS. 5 and 6 in order to reduce power consumption during memory accesses. In another embodiment, SDRAM 1114 and/or SRAM 1116 may be low power, high yield memory as described in FIGS. 5 and 6.

Figure 12:
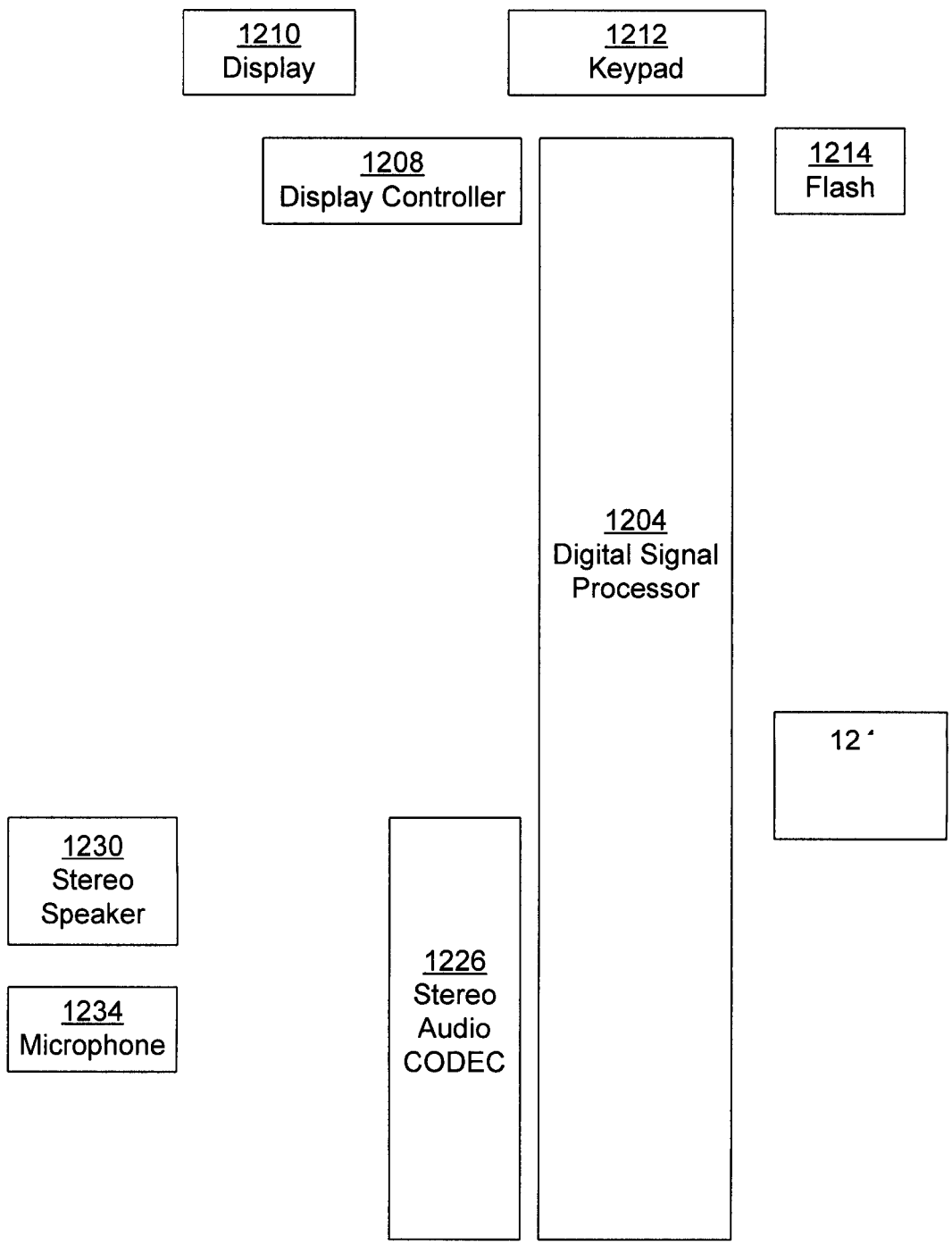
FIG. 12 is a general diagram illustrating an example portable digital assistant that may include a low power, high yield memory.

FIG. 12 is a diagram illustrating an exemplary embodiment of a portable digital assistant (PDA) 1200. As shown, the PDA 1200 includes an on-chip system 1202 that includes a digital signal processor (DSP) 1204. A touchscreen controller 1206 and a display controller 1208 are coupled to the DSP 1204.

Further, a touchscreen display 1210 is coupled to the touchscreen controller 1206 and to the display controller 1208. The general diagram of FIG. 12 also indicates that a keypad 1212 may be coupled to the DSP 1204.

In a particular embodiment, a stereo audio CODEC 1226 may be coupled to the DSP 1204. A first stereo amplifier 1228 may be coupled to the stereo audio CODEC 1226 and a first stereo speaker 1230 may be coupled to the first stereo amplifier 1228. Additionally, a microphone amplifier 1232 may be coupled to the stereo audio CODEC 1226 and a microphone 1234 may be coupled to the microphone amplifier 1232. The general diagram of FIG. 12 further shows that a second stereo amplifier 1236 may be coupled to the stereo audio CODEC 1226 and a second stereo speaker 1238 may be coupled to the second stereo amplifier 1236. In a particular embodiment, stereo headphones 1240 may also be coupled to the stereo audio CODEC 1226.

The general diagram of FIG. 12 also illustrates that an 802.11 controller 1242 may be coupled to the DSP 1204 and an 802.11 antenna 1244 may be coupled to the 802.11 controller 1242. Moreover, a Bluetooth controller 1246 may be coupled to the DSP 1204 and a Bluetooth antenna 1248 may be coupled to the Bluetooth controller 1246. A USB controller 1250 may be coupled to the DSP 1204 and a USB port 1252 may be coupled to the USB controller 1250. Additionally, a smart card 1254, e.g., a multimedia card (MMC) or a secure digital card (SD), may be coupled to the DSP 1204. Further, a power supply 1256 may be coupled to the on-chip system 1202 and may provide power to the various components of the PDA 1200.

As indicated in the general diagram of FIG. 12, the display 1210, the keypad 1212, the IrDA port 1222, the digital camera 1224, the first stereo speaker 1230, the microphone 1234, the second stereo speaker 1238, the stereo headphones 1240, the 802.11 antenna 1244, the Bluetooth antenna 1248, the USB port 1252, and the power supply 1250 may be external to the on-chip system 1202 and coupled to one or more components on the on-chip system. In a particular embodiment, the DSP 1204 includes a low power, high yield memory 1262 as described in FIGS. 5 and 6 in order to reduce power consumption during memory accesses. In another embodiment, SDRAM 1218 and/or an SRAM (not shown) may be low power, high yield memory as described in FIGS. 5 and 6.

Figure 13:
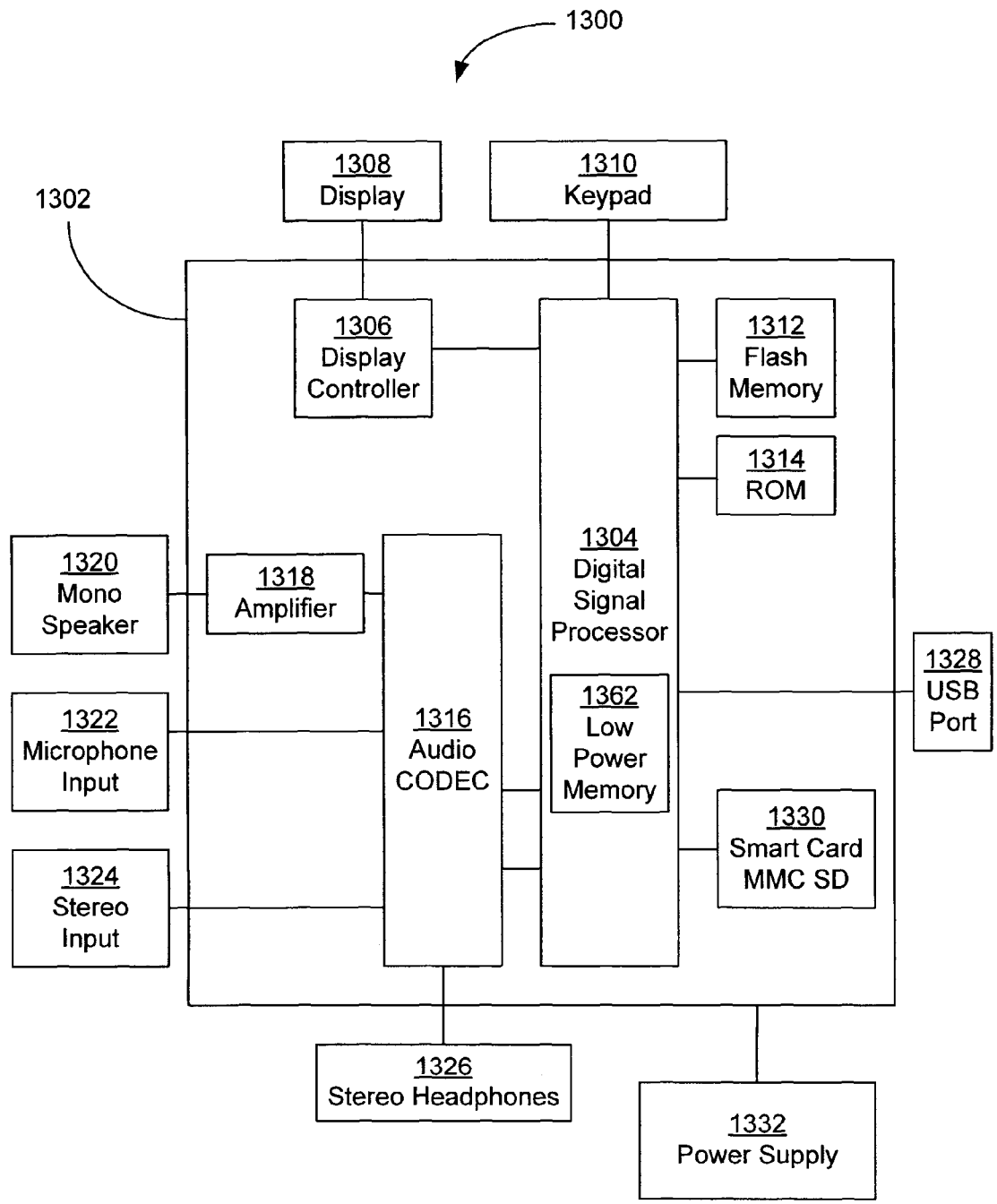
FIG. 13 is a general diagram illustrating an example audio file player that may include a low power, high yield memory.

FIG. 13 is a diagram illustrating an exemplary embodiment of an audio file player (e.g., MP3 player) 1300. As shown, the audio file player 1300 includes an on-chip system 1302 that includes a digital signal processor (DSP) 1304. A display controller 1306 may be coupled to the DSP 1304 and a display 1308 is coupled to the display controller 1306. In an exemplary embodiment, the display 1308 is a liquid crystal display (LCD). A keypad 1310 may be coupled to the DSP 1304.

As further depicted in the general diagram of FIG. 13, a flash memory 1312 and a read only memory (ROM) 1314 may be coupled to the DSP 1304. Additionally, in a particular embodiment, an audio CODEC 1316 may be coupled to the DSP 1304. An amplifier 1318 may be coupled to the audio CODEC 1316 and a mono speaker 1320 may be coupled to the amplifier 1318. The general diagram of FIG. 13 further indicates that a microphone input 1322 and a stereo input 1324 may also be coupled to the audio CODEC 1316. In a particular embodiment, stereo headphones 1326 may also be coupled to the audio CODEC 1316.

A USB port 1328 and a smart card 1330 may be coupled to the DSP 1304. Additionally, a power supply 1332 may be coupled to the on-chip system 1302 and may provide power to the various components of the audio file player 1300.

As indicated in the general diagram of FIG. 13, the display 1308, the keypad 1310, the mono speaker 1320, the microphone input 1322, the stereo input 1324, the stereo headphones 1326, the USB port 1328, and the power supply 1332 are external to the on-chip system 1302 and coupled to one or more components on the on-chip system 1302. In a particular embodiment, the DSP 1304 includes a low power, high yield memory 1362 as described in FIGS. 5 and 6 in order to reduce power consumption during memory accesses. In another embodiment, a memory coupled to the DSP 1304 (not shown) may be low power, high yield memory as described in FIGS. 5 and 6.

General

The foregoing description of the embodiments of the inventive concepts disclosed herein has been presented only for the purpose of illustration and description and is not intended to be exhaustive or to limit the inventive concepts disclosed herein to the precise forms disclosed. Numerous modifications and adaptations are apparent to those skilled in the art without departing from the spirit and scope of the inventive concepts disclosed herein.

What is claimed is:

1. A system, comprising:
 a memory cell configured to receive a memory supply voltage;
 a memory supply voltage control circuit configured to modify the memory supply voltage from a first memory supply voltage level to a second memory supply voltage level for a write to the memory cell;
 a bitline voltage control circuit configured to modify a bitline voltage from a first bitline voltage level to a second bitline voltage level that is lower than the first bitline voltage level for a read from the memory cell; and
 a control circuit to tune the second memory supply voltage level to achieve a particular power consumption level and a particular yield level from the memory cell, wherein the control circuit tunes the second memory supply voltage level based on a ring oscillator.

2. The system of claim 1, further comprising:
 a wordline control logic coupled to the memory cell, wherein the wordline control logic is configured to output a wordline voltage; and
 a wordline voltage control circuit configured to modify the wordline voltage from a first wordline voltage level to a second wordline voltage level for a read from the memory cell.

3. The system of claim 2, wherein the wordline voltage control circuit is a voltage divider.

4. The system of claim 2, wherein the wordline voltage control circuit includes an enable input configured to enable the wordline voltage control circuit to modify the wordline voltage.

5. The system of claim 2, wherein the wordline voltage control circuit includes a selection input to determine the second wordline voltage level.

6. The system of claim 2, further comprising:
 a bitline control logic couplable to the memory cell, wherein the bitline control logic is configured to output the bitline voltage.

7. The system of claim 4, wherein the bitline voltage control circuit is a voltage divider.

8. The system of claim 1, wherein the memory supply voltage control circuit includes an enable input configured to enable the memory supply voltage control circuit to modify the memory supply voltage.

9. The system of claim 1, wherein the memory supply voltage control circuit includes a selection input to determine the second memory supply voltage level.

10. The system of claim 1, further comprising:
a second memory cell to receive a second memory supply voltage; and
a second memory supply voltage control circuit configured to maintain the second memory supply voltage at the first memory supply voltage level for a write to the memory cell.

11. A method, comprising:
modifying a memory supply voltage of a memory cell from a first memory supply voltage level to a second memory supply voltage level for a write to the memory cell;
performing the write to the memory cell using the memory supply voltage at the second memory supply voltage level; and
modifying a bitline voltage of a bitline control logic couplable to the memory cell from a first bitline voltage level to a second bitline voltage level that is less than the first bitline voltage level for a read from the memory cell; and
a control circuit to tune the second memory supply voltage level to achieve a particular power consumption level and a particular yield level from the memory cell, wherein the control circuit tunes the second memory supply voltage level based on a ring oscillator.

12. The method of claim 11, further comprising:
modifying a wordline voltage of a wordline control logic couplable to the memory cell from a first wordline voltage level to a second wordline voltage level for a read from the memory cell.

13. The method of claim 12, further comprising modifying the wordline voltage from the first wordline voltage level to the second wordline voltage level for a write to the memory cell.

14. The method of claim 12, further comprising determining the second wordline voltage level for the wordline voltage from a wordline selection input.

15. The method of claim 12, further comprising modifying the bitline voltage from the first bitline voltage level to the second bitline voltage level for a write to the memory cell.

16. The method of claim 11, further comprising determining the second memory supply voltage level for the memory supply voltage from a memory supply selection input.

17. A system, comprising:
means for modifying a memory supply voltage of a memory cell from a first memory supply voltage level to a second memory supply voltage level for a write to the memory cell;
means for performing the write to the memory cell using the memory supply voltage at the second memory supply voltage level;
means for modifying a bitline voltage of bitline control logic couplable to the memory cell from a first bitline voltage level to a second bitline voltage level that is less than the first bitline voltage level for a read from the memory cell; and
a control circuit to tune the second memory supply voltage level to achieve a particular power consumption level and a particular yield level from the memory cell, wherein the control circuit tunes the second memory supply voltage level based on a ring oscillator.

18. The system of claim 17, further comprising:
means for modifying a wordline voltage of a wordline control logic couplable to the memory cell from a first wordline voltage level to a second wordline voltage level for a read from the memory cell.

* * * * *